United States Patent [19]
Kendel

[11] Patent Number: 5,175,668
[45] Date of Patent: Dec. 29, 1992

[54] CIRCUIT BOARD FOR A COMPONENT REQUIRING HEAT SINKAGE

[75] Inventor: Michael L. Kendel, New Braunfels, Tex.

[73] Assignee: Motorola, Inc., Schaumburg, Ill.

[21] Appl. No.: 621,135

[22] Filed: Dec. 3, 1990

[51] Int. Cl.⁵ ............................................. H05K 7/20
[52] U.S. Cl. ................................... 361/386; 361/383; 361/400; 361/387
[58] Field of Search ............................ 165/80.3, 185; 174/16.3; 357/79, 81; 361/386–389, 400, 383

[56] References Cited

U.S. PATENT DOCUMENTS

| | | | |
|---|---|---|---|
| 4,729,061 | 3/1988 | Brown | 361/414 |
| 4,803,590 | 2/1989 | Fassel et al. | 361/388 |
| 4,922,378 | 5/1990 | Malhi et al. | 361/387 |
| 4,972,294 | 11/1990 | Moses, Jr. et al. | 361/386 |

FOREIGN PATENT DOCUMENTS 3305167  8/1984  Fed. Rep. of Germany ...... 361/387

*Primary Examiner*—Gregory D. Thompson
*Attorney, Agent, or Firm*—John H. Moore

[57] ABSTRACT

A circuit board (2) for receiving a component (38) requiring heat sinkage. The circuit board has a base portion (4) and a heat sink form portion (6) integral with the base portion. The heat sink form portion has a heat sink form and a coating (58) of thermally conductive material thereon to produce a heat sink. The heat sink has an aperture (32, 34) between a front surface (10) for contacting the component and a back surface (12) remote from the component to allow heat to be conducted directly from the front surface to the back surface. An integral resilient clamp (46-52) holds the component in contact with the heat sink. The integral nature of the base portion, the heat sink and the clamp provides a simple one piece board and the aperture enhances the heat sink efficiency by providing a direct heat conduction path to the back surface.

8 Claims, 1 Drawing Sheet

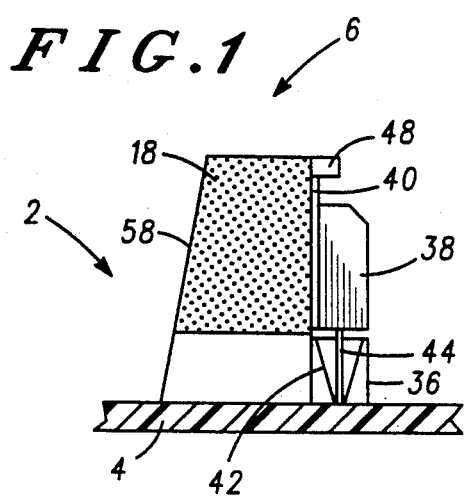
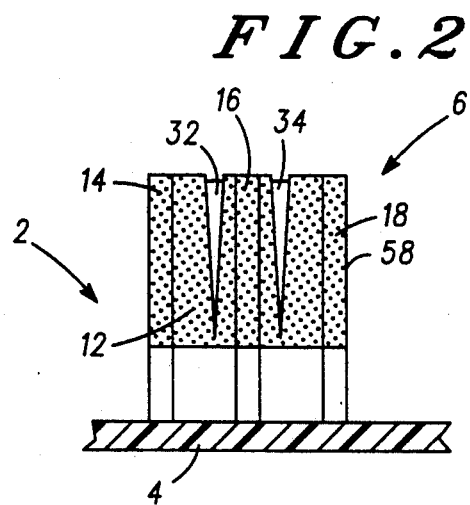
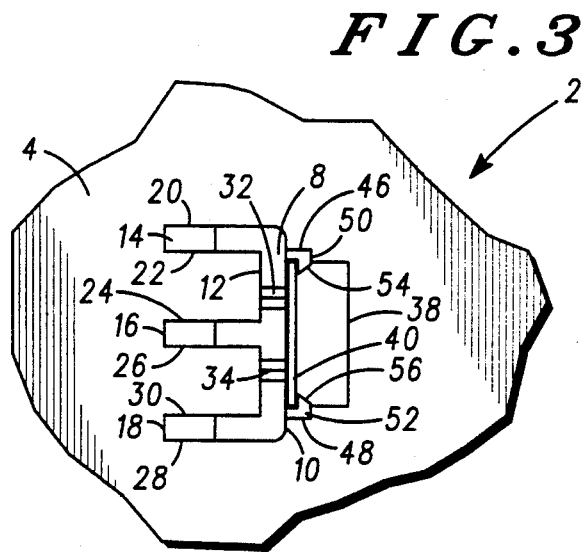
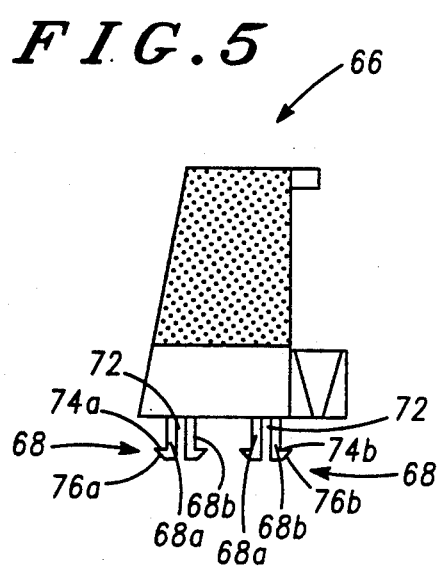
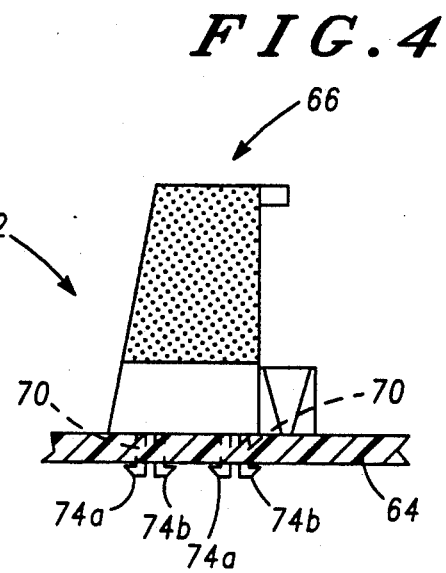

CIRCUIT BOARD FOR A COMPONENT REQUIRING HEAT SINKAGE

FIELD OF THE INVENTION

This invention relates to circuit boards for components requiring heat sinkage.

BACKGROUND OF THE INVENTION

In circuit boards for components requiring heat sinkage, e.g. power transistors, heat sinkage is typically provided in the form of an additional thermally conducting element which is fixed to the component. However, such a practice increases the complexity and time required for circuit assembly.

SUMMARY OF THE INVENTION

It is an object of the present invention to provide an improved circuit board for a component requiring heat sinkage wherein the above disadvantage may be overcome or at least alleviated.

In accordance with the present invention there is provided a circuit board for receiving a component requiring heat sinkage, the circuit board comprising:
a base portion;
a heat sink form portion extending from the base portion and having a heat sink form; and
a coating of thermally conductive material on the heat sink form portion to produce a heat sink, the heat sink having at least one aperture therein between a first surface for contacting the component and a second surface remote from the first surface to allow heat to be conducted directly from the first surface to the second surface.

BRIEF DESCRIPTION OF THE DRAWINGS

Two circuit boards in accordance with the invention will now be described, by way of example only, with reference to the accompanying drawings, in which:

FIG. 1 shows a part cross-sectional, side elevational view of a first circuit board and an attached component;

FIG. 2 shows a part cross-sectional, side elevational view of the circuit board of FIG. 1 from a side remote from the component;

FIG. 3 shows a plan view from above of the circuit board of FIGS. 1 and 2;

FIG. 4 shows a part cross-sectional, side elevational view of a second circuit board and an attached component from one side; and FIG. 5 shows a side elevational view of a separate heat sink form portion used in the circuit board of FIG. 4.

DESCRIPTION OF THE PREFERRED EMBODIMENT

Referring now to FIGS. 1-3, a printed circuit board 2 has a planar base portion 4 and an upstanding integral heat sink from portion 6. The base portion 4 and the integral heat sink from portion 6 are formed as a single composite component, e.g. molded in one piece from conventional thermally-insulating, thermo-plastic material.

The heat sink from portion 6 is shaped to form a heat sink having an upstanding flat wall 8, which extends from the base portion and has front and back surfaces 10 and 12, respectively. The heat sink form portion also has three upstanding fins 14, 16 and 18 which extend in parallel from the back surface 12 of the wall 8 and which define surfaces 20, 22, 24, 26, 28 and 30. Like the wall 8, the fins 14, 16 and 18 extend from the base portion 4.

The wall 8 is provided with two "V"-shaped slots 32 and 34 which extend into the wall from the top side of the wall. The slots 32 and 34 also extend between the front and back surfaces 10 and 12 of the wall and provide apertures therebetween.

The wall 8 is also provided with, on its front surface 10 at its junction with the base portion 4, a shoulder 36 for seating a power transistor 38 in a conventional TO220 package with a metal backing tab 40. The shoulder 36 has three holes 42 spaced to receive the three leads of a TO220 package. The holes 42 extend through the shoulder 36 to the base portion 4 where they align with holes (not shown) through the base portion for electrically connecting the leads of the power transistor 38, as will be described below. The holes 42 through the shoulder 36 are wider at their tops and taper towards their bottoms in order to facilitate insertion of the leads 44.

The wall 8 is also provided on its front surface 10 with two short arms 46 and 48 which extend from the top of the wall in an opposite direction from the fins 14, 16 and 18. The arms 46 and 48 are spaced apart by nominally the width of the TO220-packaged transistor 38 and have at their outer ends mutually facing teeth 50 and 52 having inclined front surfaces 54 and 56, respectively.

As mentioned above, the heat sink form portion constituted by the wall 8, the fins 14, 16 and 18, the shoulder 36 and the arms 46 and 48 is formed integrally with, and of the same thermo-plastic material as, the base portion 4. As mentioned above, the board 2 may typically be fabricated as a one-piece molding. The lower side of the board 2 is then plated, in conventional manner, with a copper foil (not shown) which is then etched in a predetermined pattern (also not shown) to provide a desired interconnection between the transistor 38 and other components (not shown).

The heat sink form portion is also plated, in the same way, with copper foil 58. The copper foil plating 58 extends downwards from the top of the heat sink form portion only to the top of the shoulder 36, entirely covering the slots 32 and 34 and the arms 46 and 48, and partly covering the wall 8 and the fins 14, 16 and 18. The shoulder 36 and a region of the wall 8 and of the fins 14, 16 and 18 adjacent the base portion 4 are left uncovered.

In use of the circuit board 2, the ends of the leads 44 of the TO220-packaged power transistor 38 are inserted into the holes in the shoulder 36, and the transistor 38 is then pushed down towards the base portion 4 and back towards the front surface 10 of the wall 8.

As the transistor is pushed down towards the base portion 4, its leads 44 are guided into and through the holes 42 and finally into and through the holes (not shown) in the base portion 4. Finally, the transistor comes to rest with the bottom of its encapsulation seated on the top of the shoulder 36.

As the transistor is pushed back towards the front surface 10 of the wall 8, it pushes against the inclined front surfaces 54 and 56 of the teeth 50 and 52 on the arms 46 and 48. As the transistor 38 pushes against the inclined surfaces of the teeth, the arms are forced apart, against the reaction of their own resilience, until the tips of the teeth are far enough apart for the transistor 38 to move between them. The transistor 38 then moves between the arms 48 and 50 and its metal backing tab 40 moves past the teeth 50 and 52 and contacts the front surface 10 of the wall 8. As soon as the metal backing tab 40 of the transistor 38 has passed the teeth 50 and 52, the resilience of the arms 46 and 48 causes the arms to snap back toward their rest positions, in which the teeth serve to hold the transistor in place with its metal backing tab 40 in contact with the front surface 10 of the wall 8.

With the transistor 38 now firmly held in position, any remaining components (not shown) are inserted into the board 2 and the leads of the transistor 38 (and the other components, if any) are soldered to the plated interconnection pattern (not shown) on the underside of the board 2. It will be appreciated that during the soldering or any subsequent processing, the transistor 38 remains firmly held in position.

In use of the circuit board, the plated heat sink from portion functions as follows. The power transistor 38 contacts the plated copper foil layer 58 on the front surface 10 of the wall 8, and heat generated by the transistor 38 is conducted through the plated copper foil layer 58 to the fins 14, 16 and 18, where it is transferred to the surrounding air in conventional manner. It will be understood that heat from the copper layer 58 on the front surface 10 of the wall 8 is conducted directly to the back surface 12 of the wall through the slots 32 and 34 and from there is conducted rapidly to the inner surfaces 22, 24, 26 and 28. In this way it will be appreciated that the slots 32 and 34 act as "feedthrough" apertures, enabling heat to be conducted rapidly from the front surface 10 of the wall 8 to the heat dissipating inner surface 22, 24, 26, and 28 of the fins 14, 16 and 18; this obviates the need for the heat to be conducted to the inner surfaces only after passing across the outer surfaces 20 and 30 of the fins, which would be the case if the slots 32 and 34 were not present. Thus the slots 32 and 34 allow each of the heat conduction paths through the copper layer 58 from the front surface 10 of the wall 8 to the dissipative surfaces 20, 22, 24, 26, 28 and 30 to be of approximately the same length, so enabling each of the fins 14, 16 and 18 to be equally and fully effective in dissipating heat from the transistor 38.

In addition to the advantages described, it will be appreciated that the circuit board 2 also offers the following additional advantages:

Firstly, since the copper layer 58 on the heat sink does not extend to the base portion 4, this allows the manufacturer to "mask" the heat sink form portion (in order to prevent the copper from being removed during etching operations) by a simple dipping operation. This feature also allows selective plating of the heat sink from portion, allowing the copper of the heat sink to be thicker than that of the rest of the circuit board and so reducing the thermal resistance of the copper layer 58 on the heat sink.

The fact that the copper layer 58 of the heat sink does not extend to the base portion 4 also allows it to be electrically isolated from the rest of the circuitry, if desired. Alternatively, it could be connected to a desired part of the rest of the circuitry for electromagnetic interference protection, radio frequency interference protection, static discharge protection, safety or other reasons.

Secondly, the incorporation of the shoulder 36, which acts as a "seating block" for the transistor 38 and whose tapered holes 42 aid in the transistor's insertion, obviates the need for lead "pre-forming" and automatically establishes the transistor's height above the base portion 4 of the board.

Thirdly, although the arms 46 and 48 and their teeth 50 and 52 serve primarily to lock the transistor 38 in place so as to hold it in contact with the front surface 10 of the wall 8, they also serve to prevent the transistor from moving during subsequent manufacturing operations which may occur before soldering, and also serve to eliminate vibrational mechanical problems which many such devices experience in operation due to their large size.

It will, of course, be appreciated that the invention is not limited to the particular circuit board 2 and heat sink form portion 6 described above, for example: the number, shape and/or size of the fins 14, 16 and 18 may be varied if required, or fins may be dispensed with completely; the number, size and/or shape of the slots 32 and 34 may be varied if desired or may be replaced by holes or other apertures; the shape and/or size of the heat sink form portion may be changed to accommodate a component other than a TO220-packaged transistor; the board may be made from a material other than a thermo-plastic material, e.g. a thermo-setting material; or the thermally conducting copper layer 58 may be replaced or augmented by other thermally conducting material(s).

Referring now to FIGS. 4 and 5, in a variation of the circuit board 2 a circuit board assembly 62 has a base portion 64 and a heat sink form portion 66 molded of the same thermo-plastic material as the board 2. However, unlike in the board 2 where the base portion 4 and the heat sink form portion are molded as a single component, the base portion 64 and the heat sink form portion 66 are molded as separate components and are fixed together in the following way to form the single, composite board assembly 62.

The heat sink form portion 66 is formed with "snap feature" legs 68 extending down from its base, and the base portion 64 is formed with mating holes 70 into which the legs 68 are snapped to locate and to fix the heat sink form portion to the base portion to create a single, composite board assembly 62. As can be seen from FIG. 5, the legs 68 are formed with a longitudinal slot 72 to define sub-legs 68*a* and 68*b*, each having a foot 74*a*, 74*b* at its lower end. The feet 74*a* and 74*b* each have an inclined bottom surface 76*a*, 76*b* respectively.

To assemble the composite board assembly 62, the heat sink form portion 66 is positioned with the inclined surfaces 76*a*, 76*b* of its feet 74*a*, 74*b* resting on the edge of the mating holes 70. The heat sink form portion 66 is then pushed down, forcing the feet 74*a*, 74*b* of each of its legs resiliently together, and allowing the legs 68 to move down through the holes 70. When the feet 74*a*, 74*b* reach the bottoms of the holes 70, they resiliently snap outwards and lock the heat sink form portion 66 with the base portion 64 to form the single, composite board assembly 62. If the feet 74*a* and 74*b* are copper-plated, they will become joined to the board permanently by the subsequent soldering operation on the board.

In all other respects the heat sink form portion 66 and the base portion 62 are identical with the heat sink form portion 4 and the base portion 2 of the circuit board 2, and function in exactly the same manner as described above.

It will be appreciated that various other modifications or alternatives to the above described embodiment will be apparent to a person skilled in the art without departing from the inventive concept.

I claim:

1. A circuit board for receiving a component requiring heat sinkage, the circuit board comprising:
    a base portion;
    a heat sink form portion extending from the base portion and having a heat sink form; and
    a coating of thermally conductive material on the heat sink form portion to produce a heat sink, the heat sink form portion having a shoulder adjacent the base portion for seating the component, and the shoulder having a hole therein through which a lead of the component may pass to the base portion.

2. A circuit board for receiving a component requiring heat sinkage, the circuit board comprising:
    a base portion;
    a heat sink form portion extending from the base portion and having a heat sink form; and
    a coating of thermally conductive material on the heat sink form portion to produce a heat sink, the heat sink having at least one aperture therein between a first surface for contacting the component and a second surface remote from the first surface to allow heat to be conducted directly from the first surface to the second surface, and wherein the heat sink form portion has a shoulder adjacent the base portion for seating the component, and the shoulder has a hole therein through which a lead of the component may pass to the base portion.

3. A circuit board according to claim 1, wherein the hole is tapered to facilitate insertion of the lead.

4. A circuit board according to claim 1 further comprising resilient clamp means for holding the component in contact with the heat sink.

5. A circuit board according to claim 4 wherein the resilient clamp means comprises at least one arm integral with the heat sink form portion and attached at one end thereto, the arm being positioned to receive the component between itself and the heat sink.

6. A circuit board according to claim 5 wherein the arm has a tooth for holding the component.

7. A circuit board according to claim 1 wherein the circuit board and heat sink form portion are molded from thermo-plastic material.

8. A circuit board according to claim 1 wherein the coating is copper.

* * * * *